US010691243B2

(12) United States Patent
Hei et al.

(10) Patent No.: US 10,691,243 B2
(45) Date of Patent: Jun. 23, 2020

(54) FLEXIBLE TOUCH DISPLAY PANEL AND METHOD AND SYSTEM FOR DETECTING FOLDING ANGLE OF FLEXIBLE TOUCH DISPLAY PANEL

(71) Applicant: Wuhan Tianma Micro-Electronics Co., Ltd., Wuhan (CN)

(72) Inventors: Yajun Hei, Wuhan (CN); Jingxiong Zhou, Shanghai (CN); Ruiyuan Zhou, Xiamen (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/153,841

(22) Filed: Oct. 8, 2018

(65) Prior Publication Data

US 2019/0042042 A1 Feb. 7, 2019

(30) Foreign Application Priority Data

Jun. 27, 2018 (CN) .......................... 2018 1 0679301

(51) Int. Cl.
| | |
|---|---|
| *G06F 3/041* | (2006.01) |
| *G06F 3/044* | (2006.01) |
| *G06F 3/047* | (2006.01) |
| *H01L 51/50* | (2006.01) |
| *G06F 1/16* | (2006.01) |

(52) U.S. Cl.
CPC .......... *G06F 3/0412* (2013.01); *G06F 1/1652* (2013.01); *G06F 3/044* (2013.01); *G06F 3/047* (2013.01); *G06F 3/0416* (2013.01); *H01L 51/50* (2013.01); *G06F 2203/04102* (2013.01); *H01L 2251/5338* (2013.01)

(58) Field of Classification Search
CPC ...... G06F 3/0412; G06F 3/0416; G06F 3/044; G06F 3/047; G06F 1/1652; H01L 51/50
USPC ................................... 345/156, 173; 715/835
See application file for complete search history.

(56) References Cited

U.S. PATENT DOCUMENTS

| 5,149,919 A | * | 9/1992 | Greanias ............. G06F 3/03545 |
| | | | 178/18.02 |
| 10,230,367 B2 | * | 3/2019 | Kim ..................... H03K 17/955 |
| 2009/0174469 A1 | * | 7/2009 | Fallah ................. H03K 19/0016 |
| | | | 327/544 |

(Continued)

FOREIGN PATENT DOCUMENTS

CN 107329624 A 11/2017

*Primary Examiner* — Prabodh M Dharia
(74) *Attorney, Agent, or Firm* — Kilpatrick Townsend & Stockton, LLP

(57) ABSTRACT

A flexible touch display panel and a method and a system for detecting a folding angle of the flexible touch display panel are provided. The method includes inputting a first scan signal to the touch electrode and obtaining a channel capacitance value of the touch electrode, determining whether the channel capacitance value is greater than a sleep threshold, controlling the flexible touch display panel to enter a sleep state in a case that the channel capacitance value is greater than the sleep threshold, and determining a capacitance value interval in which the channel capacitance value is located and determining a current folding angle of the flexible touch display panel based on a correspondence between the capacitance value interval and the folding angle in a case that the channel capacitance value is not greater than the sleep threshold.

14 Claims, 6 Drawing Sheets

(56) References Cited

U.S. PATENT DOCUMENTS

| | | | | |
|---|---|---|---|---|
| 2012/0217981 A1* | 8/2012 | Erdogan | ............ | G01R 27/2605 |
| | | | | 324/679 |
| 2013/0111245 A1* | 5/2013 | Giat | .................... | H04L 12/4625 |
| | | | | 713/323 |
| 2013/0127774 A1* | 5/2013 | Hong | ...................... | G06F 3/044 |
| | | | | 345/174 |
| 2014/0267108 A1* | 9/2014 | Chung | .................... | G06F 3/044 |
| | | | | 345/173 |
| 2015/0077389 A1* | 3/2015 | Ding | ...................... | G06F 3/044 |
| | | | | 345/174 |
| 2015/0338888 A1* | 11/2015 | Kim | ...................... | G06F 1/1677 |
| | | | | 345/156 |
| 2015/0378557 A1* | 12/2015 | Jeong | .................... | G06F 3/0488 |
| | | | | 715/835 |
| 2016/0109973 A1* | 4/2016 | Kim | ...................... | G06F 3/041 |
| 2017/0035329 A1* | 2/2017 | Gavish | ................. | A61B 5/1135 |
| 2017/0102738 A1* | 4/2017 | Park | ...................... | G06F 1/1652 |

\* cited by examiner

FLEXIBLE TOUCH DISPLAY PANEL AND METHOD AND SYSTEM FOR DETECTING FOLDING ANGLE OF FLEXIBLE TOUCH DISPLAY PANEL

CROSS REFERENCE OF RELATED APPLICATION

This application claims the priority to Chinese Patent Application No. 201810679301.X, titled "FLEXIBLE TOUCH DISPLAY PANEL AND METHOD AND SYSTEM FOR DETECTING FOLDING ANGLE OF FLEXIBLE TOUCH DISPLAY PANEL", filed on Jun. 27, 2018 with the Chinese Patent Office, which is incorporated herein by reference in its entirety.

FIELD

The present disclosure relates to the field of display technology, and in particular to a flexible touch display panel and a method and a system for detecting a folding angle of the flexible control display panel.

BACKGROUND

With development of the display technology, the flexible display technology is widely applied. The conventional flexible display panel has at least one foldable region, i.e., bending region, and can be folded along the bending region.

When the flexible display panel is folded, different folding states may correspond to different display states. For example, when non-bending regions on both sides of the bending region are overlapped, the flexible display panel may enter a standby state. In order that different display states correspond to different folding states, it is required to provide an additional detection sensor in the flexible display panel for detecting a folding angle, such as a photoelectric sensor or a mechanical sensor. However, the additionally provided sensor not only causes a more complex structure of the flexible display panel, but also causes a higher production cost of the flexible display panel.

SUMMARY

In view of this, a flexible touch display panel, and a method and a system for detecting a folding angle of the flexible touch display panel are provided according to the present disclosure, so as to solve a problem that an additionally provided detection sensor in the flexible display panel for detecting the folding angle may cause a more complex structure and a higher production cost of the flexible display panel.

A method for detecting a folding angle a flexible touch display panel is provided. The flexible touch display panel includes at least one bending region and non-bending regions located on both sides of the bending region, each of the bending region and the non-bending regions is provided with multiple touch electrodes. The method includes: inputting a first scan signal to the touch electrode and obtaining a channel capacitance value of the touch electrode, determining whether the channel capacitance value is greater than a sleep threshold, and controlling the flexible touch display panel to enter a sleep state in a case that the channel capacitance value is greater than the sleep threshold, and determining a capacitance value interval in which the channel capacitance value is located and determining a current folding angle of the flexible touch display panel based on a correspondence between the capacitance value interval and the folding angle in a case that the channel capacitance value is not greater than the sleep threshold.

A system for detecting a folding angle of a flexible touch display panel applied to the above method for detecting a folding angle. The system includes a drive device and a processing device.

The drive device is configured to input a first scan signal to the touch electrode and obtain a channel capacitance value of the touch electrode.

The processing device is configured to determine whether the channel capacitance value is greater than a sleep threshold, control the flexible touch display panel to enter a sleep state in a case that the channel capacitance value is greater than the sleep threshold, and determine a capacitance value interval in which the channel capacitance value is located and determine a current folding angle of the flexible touch display panel based on a correspondence between the capacitance value interval and the folding angle in a case that the channel capacitance value is not greater than the sleep threshold.

A flexible touch display panel is provided. The flexible touch display panel includes the folding angle detection system described above.

With the flexible touch display panel, the method and the system for detecting a folding angle of the flexible touch display panel provided in the present disclosure, the first scan signal is inputted to the touch electrode, and the channel capacitance value of the touch electrode is obtained. Then it is determined whether the channel capacitance value is greater than the sleep threshold. The flexible touch display panel is controlled to enter the sleep state in a case that the channel capacitance value is greater than the sleep threshold. The capacitance value interval in which the channel capacitance value is located is determined and the current folding angle of the flexible touch display panel is determined based on the correspondence between the capacitance value interval and the folding angle in a case that the channel capacitance value is not greater than the sleep threshold. That is, in the present disclosure, the folding angle of the flexible touch display panel is obtained based on an induction value between the touch electrodes, i.e., the channel capacitance value and the correspondence between the capacitance value interval and the folding angle, such that the accuracy of detecting the folding angle is improved, and complexity and the production cost of the flexible touch display panel are reduced.

BRIEF DESCRIPTION OF THE DRAWINGS

The drawings to be used in the description of the embodiments of the disclosure will be described briefly as follows. It is apparent that the drawings in the following description only illustrate some embodiments of the present disclosure.

DETAILED DESCRIPTION

Figure 1:
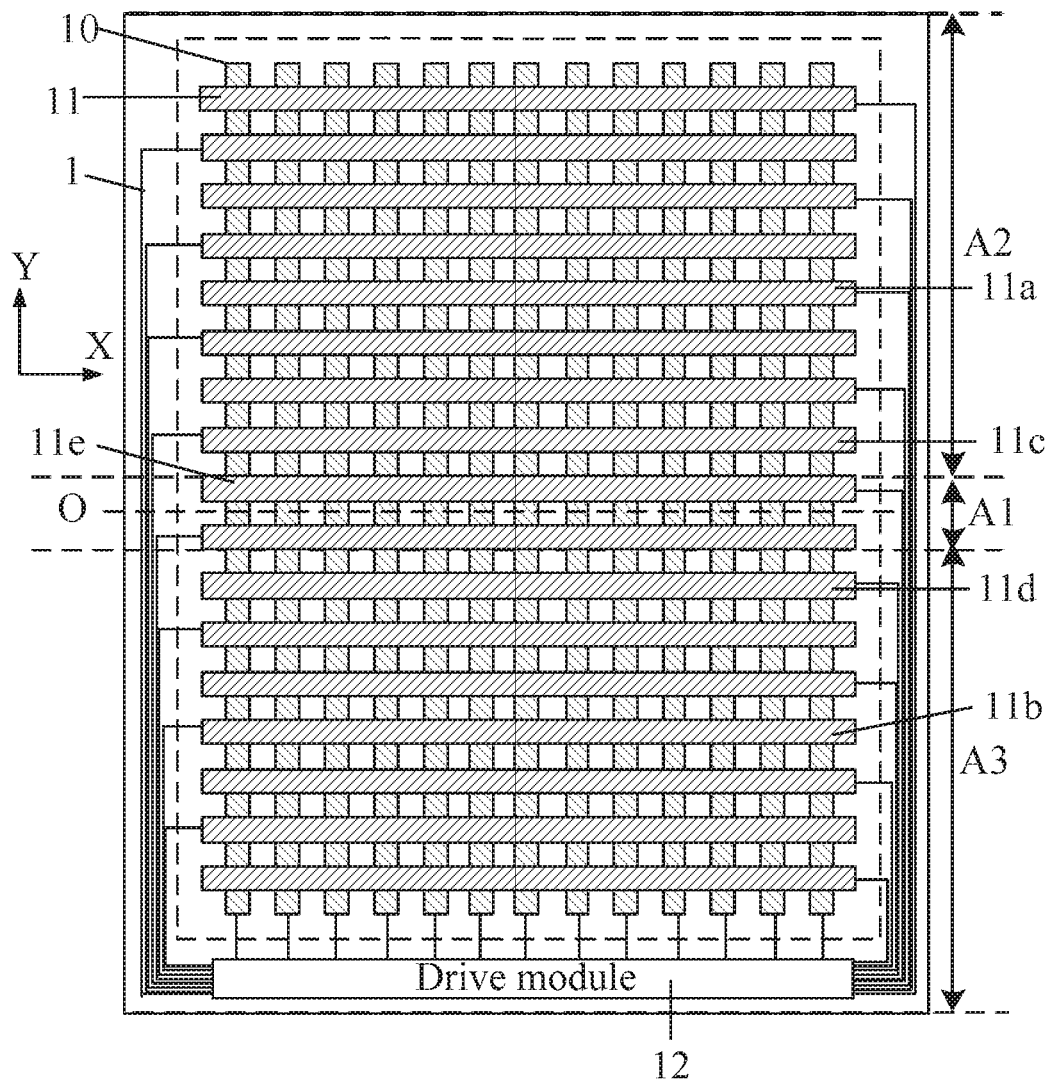
FIG. 1 is a top view showing a structure of a flexible touch display panel according to an embodiment of the present disclosure.

As described in the BACKGROUND, in an existing flexible display panel, a folding angle of the flexible display panel is detected through a detection sensor additionally provided in the flexible display panel, which may cause a more complex structure of the flexible display panel as well as a higher production cost of the flexible display panel.

The inventor found that when the flexible display panel is folded and is not touched, mutual induction is generated between a touch electrode in a non-bending region located on one side of a bending region and a touch electrode in a non-bending region located on the other side of the bending region. Different folding angles may lead to different induction values or channel capacitance values of the touch electrode. For example, as the folding angle decreases, the channel capacitance value increases, and as the folding angle increases, the channel capacitance value decreases.

In view of this, a method for detecting a folding angle a flexible touch display panel is provided according to the present disclosure so as to overcome the above problem in the conventional technology. The flexible touch display panel includes at least one bending region and non-bending regions located on both sides of the bending region. Each of the bending region and the non-bending region is provided with a touch electrode. The method for detecting a folding angle includes following steps.

A first scan signal is inputted into the touch electrode, and a channel capacitance value of the touch electrode is obtained, then it is determined whether the channel capacitance value is greater than a sleep threshold. The flexible touch display panel is controlled to enter a sleep state in a case that the channel capacitance value is greater than the sleep threshold. A capacitance value interval in which the channel capacitance value is located is determined and a current folding angle of the flexible touch display panel is determined based on a correspondence between the capacitance value interval and the folding angle in a case that the channel capacitance value is not greater than the sleep threshold.

A system for detecting a folding angle of a flexible display panel is further provided in the present disclosure, which includes a drive device and a processing device. The drive device is configured to input a first scan signal to the touch electrode and obtain a channel capacitance value of the touch electrode. The processing device is configured to determine whether the channel capacitance value is greater than a sleep threshold, control the flexible touch display panel to enter a sleep state in a case that the channel capacitance value is greater than the sleep threshold, and determine a capacitance value interval in which the channel capacitance value is located and determine a current folding angle of the flexible touch display panel based on a correspondence between the capacitance value interval and the folding angle in a case that the channel capacitance value is not greater than the sleep threshold.

A flexible touch display panel is further provided according to the present disclosure. The flexible touch display panel includes the system for detecting a folding angle described above.

With the flexible touch display panel, the method and the system for detecting a folding angle of the flexible touch display panel provided according to the present disclosure, a folding angle of the flexible touch display panel is obtained based on an induction value between the touch electrodes, i.e., the channel capacitance value and the correspondence between the capacitance value interval and the folding angle, such that the accuracy of detecting the folding angle can be improved, and complexity and the production cost of the flexible touch display panel can be reduced.

Embodiments of the present disclosure will be described clearly in conjunction with the drawings. Apparently, the described embodiments are only a few rather than all of embodiments of the present disclosure.

A method for detecting a folding angle of a flexible touch display panel is provided according to the embodiment of the present disclosure. The flexible touch display panel is integrated with a touch electrode layer. In one embodiment, the touch electrode layer is embedded in the flexible touch display panel. Moreover, the flexible touch display panel includes an organic light-emitting flexible touch display panel, etc.

As shown in FIG. 1, which is a top view showing a structure of a flexible touch display panel according to an embodiment of the present disclosure, a flexible touch display panel 1 includes at least one bending region A1, a non-bending region A2 located on one side of the bending region A1, and a non-bending region A3 located on the other side of the bending region A1. For example, the non-bending region A2 and/or the non-bending region A3 may be bended in or out the page along an axis O. Each of the bending region A1, the non-bending region A2 and the non-bending region A3 includes a touch electrode layer, which includes touch electrodes.

In the embodiment, as shown in FIG. 1, the touch electrode includes a first touch electrode 10 and a second touch electrode 11. Multiple first touch electrodes 10 are arranged in a first direction X, and multiple second touch electrodes 11 are arranged in a second direction Y. The first direction X and the second direction Y are perpendicular to each other. The drive device 12 inputs a touch detection signal to the first touch electrode 10 and detects an inductive signal outputted by the second touch electrode 11. In a case that the flexible touch display panel is touched, a capacitance at a touch position changes, the inductive signal outputted by the second touch electrode 11 changes, and the drive device 12 determines horizontal and vertical coordinates of the touch position based on a change of the inductive signal.

In the embodiment, only a case that the touch electrode is a mutual capacitance touch electrode is described. However, the present disclosure is not limited thereto. In another embodiment of the present disclosure, the touch electrode may be a self-capacitance touch electrode.

Figure 2:
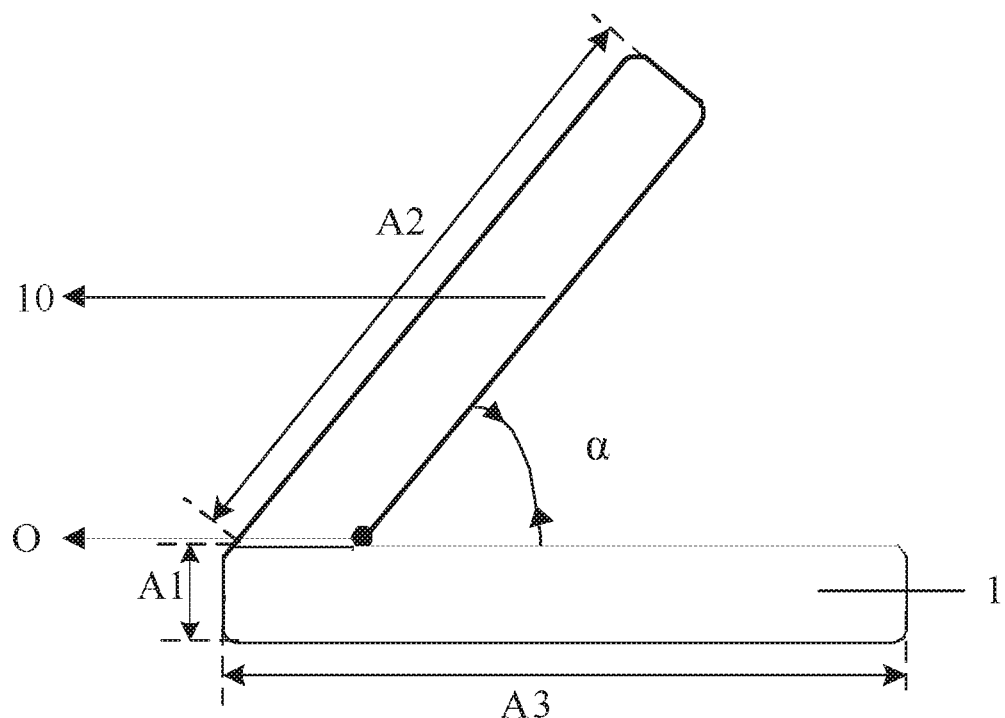
FIG. 2 is a schematic diagram showing a bending state of a flexible touch display panel according to an embodiment of the present disclosure.

As shown in FIG. 2, which is a schematic diagram showing a bending state of a flexible touch display panel according to an embodiment of the present disclosure, the two non-bending regions A2 and A3 are bended along the bending axis O in the bending region A1 in a direction. An angle between the non-bending region A2 and the non-bending region A3 of the bended flexible touch display panel 1 is a folding angle α of the flexible touch display panel. It should be noted that in the embodiment of the present disclosure, the flexible touch display panel 1 may have multiple bending regions. In the embodiment of the present disclosure, only a case that one bending region A1 is included is taken as an example for illustration. However, the present disclosure is not limited thereto.

Figure 3:
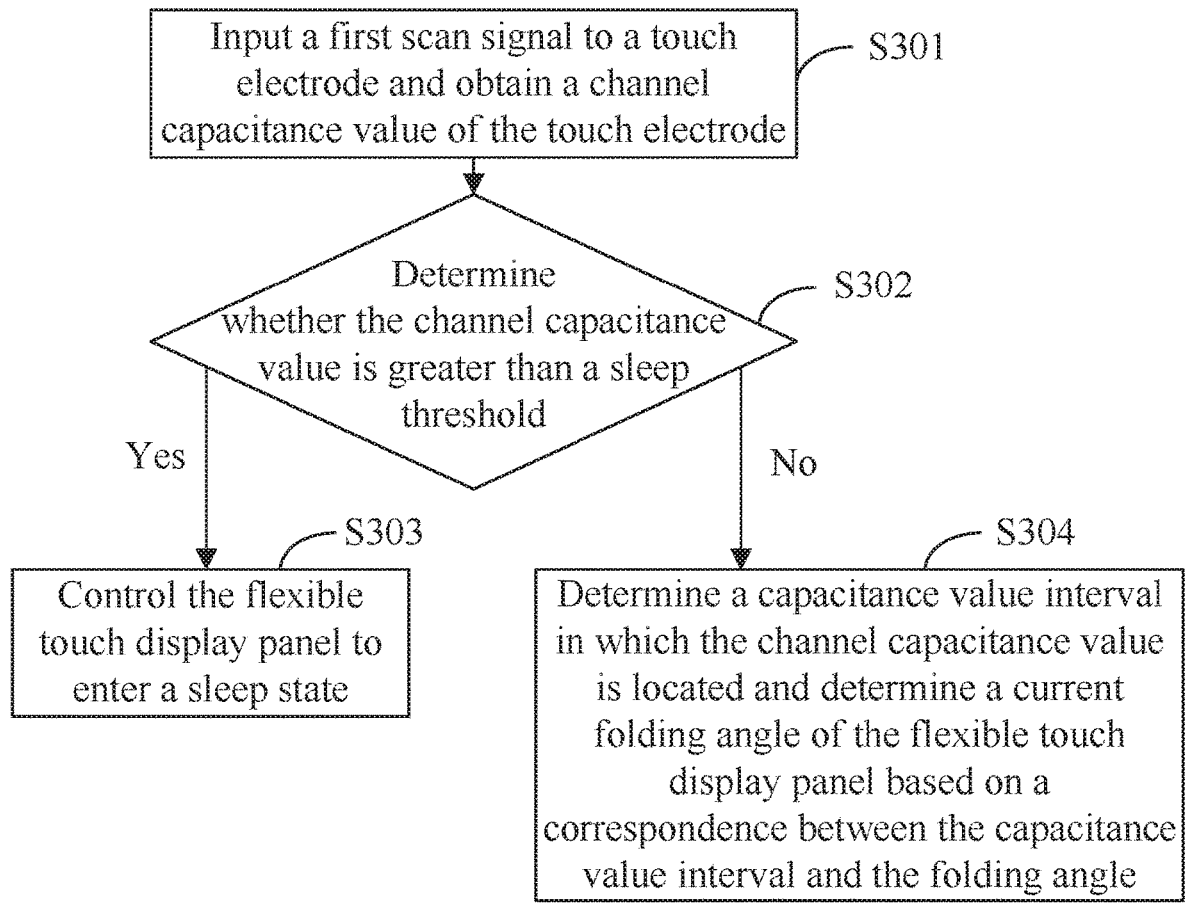
FIG. 3 is a flow chart of a method for detecting a folding angle of a flexible touch display panel according to an embodiment of the present disclosure.

As shown in FIG. 3, which is a flow chart of a method for detecting a folding angle of a flexible touch display panel according to an embodiment of the present disclosure, the method for detecting a folding angle includes the following steps S301 to S304.

In step S301, a first scan signal is inputted to a touch electrode, and a channel capacitance value of the touch electrode is obtained.

In step S302, it is determined whether the channel capacitance value is greater than a sleep threshold. The procedure goes to step S303 in a case that the channel capacitance value is greater than the sleep threshold. The procedure goes to step S304 in a case that the channel capacitance value is not greater than the sleep threshold.

In step S303, the flexible touch display panel is controlled to enter a sleep state.

In step S304, a capacitance value interval in which the channel capacitance value is located is determined and a current folding angle of the flexible touch display panel is determined based on a correspondence between the capacitance value interval and the folding angle.

It should be noted that, in a case that the touch electrode is a mutual capacitance touch electrode, the inputting the first scan signal to the touch electrode, and obtaining the channel capacitance value of the touch electrode includes: inputting the first scan signal to the first touch electrode 10 and obtaining the a channel capacitance value of the second touch electrode 11. In a case that the touch electrode is a self-capacitance touch electrode, the inputting the first scan signal to the touch electrode, and obtaining the channel capacitance value of the touch electrode includes: inputting the first scan signal to the touch electrode and obtaining the channel capacitance value of the touch electrode.

In a case that flexible touch display panel 1 is not touched, since the scan signal is inputted to the first touch electrode 10, an electromagnetic field is generated. Therefore, an electromagnetic field of the first touch electrode 10 in the non-bending region A2 and an electromagnetic field of the first touch electrode 10 in the non-bending region A3 affect each other. An inductive signal outputted by the second touch electrode 11 changes. That is, a detected channel capacitance value of the second touch electrode 11 changes. In addition, different folding angles $\alpha$ lead to different mutual induction between the electromagnetic fields and different variations of the channel capacitance value. A smaller folding angle $\alpha$ corresponds to a larger induced electromagnetic field area between the non-bending region A2 and the non-bending region A3, a stronger influence between the electromagnetic fields and a greater variation of the channel capacitance value.

Based on this, in the embodiment of the present disclosure, the channel capacitance values of the second touch electrode 11 at different folding angles $\alpha$ are obtained in advance. Then, the channel capacitance values are divided into several intervals for reducing the number of comparison and calculation amount, and a correspondence between the capacitance value interval and the folding angle is obtained. When a real-time channel capacitance value is obtained, first, the real-time channel capacitance value is compared with thresholds of the capacitance value intervals to obtain a capacitance value interval in which the real-time channel capacitance value is located. Then the folding angle $\alpha$ corresponding to the real-time channel capacitance value is determined based on the correspondence between the capacitance value interval and the folding angle. It should be noted that the folding angle $\alpha$ may be an angle value or an angle interval.

In a case that the folding angle $\alpha$ is zero or approximately zero, the non-bending region A2 and the non-bending region A3 are overlapped. In this case, the user can not view contents displayed by the flexible touch display panel 1, hence the flexible touch display panel needs to be controlled to enter the sleep state. In addition, in a case that the folding angle $\alpha$ is greater than 0°, and is less than or equal to 180°, the flexible touch display panel 1 is controlled to enter a normal working state to display an image, detect the touch position and detect the folding angle.

In a process of detecting the folding angle of the flexible touch display panel 1, the drive device 12 may constantly input the first scan signal to the first touch electrode 10 and obtain the inductive signal outputted by the second touch electrode 11. In a case that the flexible touch display panel 1 is touched, the drive device 12 may determine the touch position based on the variation of the inductive signal, i.e., the inductive signal outputted by the second touch electrode 11. In a case that the flexible touch display panel 1 is not touched but the inductive signal outputted by the second touch electrode 11 changes, the drive device 12 may transmit the inductive signal outputted by the second touch electrode 11 to the processing device of the flexible touch display panel 1 such that the processing device determines the folding angle $\alpha$ based on the inductive signal, i.e., the channel capacitance value. Since the variation of the inductive signal when the flexible touch display panel is touched is much greater than the variation of the inductive signal when the flexible touch display panel is folded, the drive device 12 can determine whether the flexible touch display panel 1 is touched or is not touched but is folded based on the variation of the inductive signal.

In a case that the flexible touch display panel 1 is not touched, when the channel capacitance value of the second touch electrode 11 is obtained, the processing device first determines whether the channel capacitance value is greater than the sleep threshold, which is the channel capacitance value of the second touch electrode 11 obtained when the folding angle $\alpha$ is zero or approximately zero. Since as the folding angle $\alpha$ decreases, the channel capacitance value increases, a case that the obtained channel capacitance value is greater than the sleep threshold indicates that the folding angle $\alpha$ is zero, and the flexible touch display panel 1 can be controlled to enter the sleep state. In a case that the obtained channel capacitance value is less than the sleep threshold, which indicates that the folding a is greater than zero, the capacitance value interval in which the channel capacitance value is located is further determined, and then a current folding angle $\alpha$ of the flexible touch display panel 1 is determined based on the correspondence between the capacitance value interval and the folding angle obtained in advance.

Figure 4:
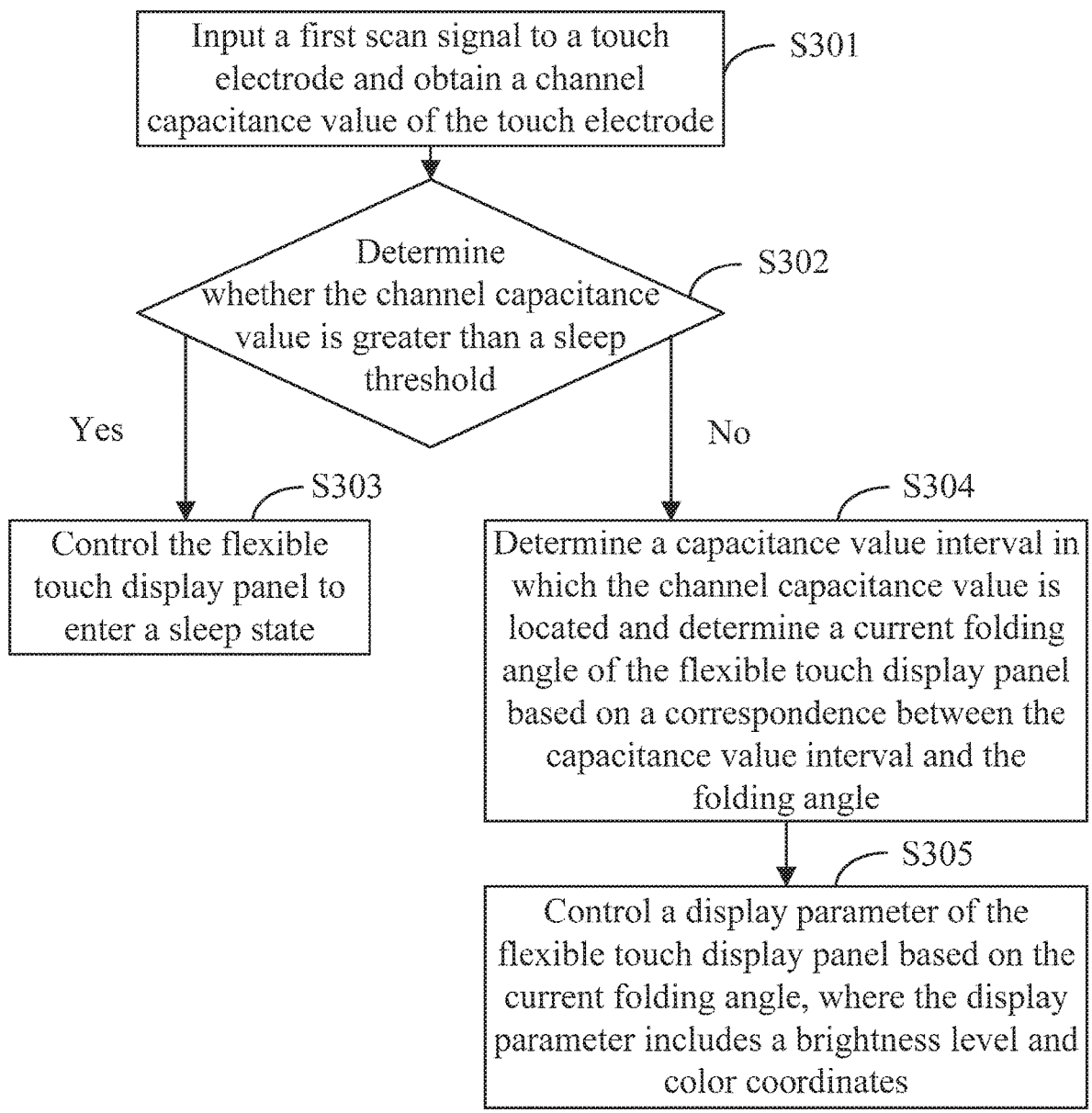
FIG. 4 is a flow chart of a method for detecting a folding angle of a flexible touch display panel according to another embodiment of the present disclosure.

Moreover, as shown in FIG. 4, which is a flow chart of a method for detecting a folding angle of a flexible touch display panel according to another embodiment of the present disclosure, the method for detecting a folding angle according to the embodiment of the present disclosure further includes step S305.

In step S305, a display parameter of the flexible touch display panel 1 are controlled based on the current folding angle. The display parameter includes a brightness level and color coordinates.

That is, when the correspondence between the channel capacitance value and the folding angle $\alpha$ is obtained in advance, a correspondence between the folding angle $\alpha$ and the display parameter is further obtained. That is, for different folding angles $\alpha$, different brightness levels and color coordinates may be set. For example, a smaller folding angle α corresponds to a lower brightness level, such that power consumption can be reduced. After obtaining the current folding angle α of the flexible touch display panel 1, the processing device may set the parameters of the flexible touch display panel 1 to be a display parameter corresponding to the current folding angle α based on the correspondence between the folding angle α and the display parameter.

Moreover, after the flexible touch display panel 1 is controlled to enter the sleep state, the method for detecting the folding angle according to the embodiment of the present disclosure further includes: inputting a second scan signal to the touch electrode, for example, inputting the second scan signal to the first touch electrode 10, where a frequency of the second scan signal is less than a frequency of the first scan signal. That is, after the processing device controls the flexible touch display panel 1 to enter the sleep state, the drive device 12 scans the first touch electrode 10 at a lower frequency. In this way, the power consumption can be reduced, while the flexible touch display panel can rapidly respond when the flexible touch display panel 1 is touched or folded.

In the embodiment, the determining whether the channel capacitance value is greater than the sleep state includes: determining whether channel capacitance values of a part of the touch electrodes are greater than the sleep threshold.

In one embodiment, according to an embodiment of the present disclosure, when the folding angle α of the flexible touch display panel 1 is detected, the processing device may obtain the current folding angle α based on channel capacitance values of all of the second touch electrodes 11. However, for reducing the workload of the processing device and the power consumption, the processing device may obtain the current folding angle α based on the channel capacitance values of a part of the second touch electrodes 11.

In one embodiment, the part of the touch electrodes includes touch electrodes located in central regions of the non-bending region A2 and the non-bending region A3, for example, a second touch electrode 11a and a second touch electrode 11b shown in FIG. 1. In one embodiment, the part of the touch electrodes includes touch electrodes located in the non-bending region A2 and the non-bending region A3 and close to the bending region A1, for example, a second touch electrode 11c and a second touch electrode 11d shown in FIG. 1. In one embodiment, the part of the touch electrodes includes the touch electrodes located in the central regions of the non-bending region A2 and the non-bending region A3 as well as the touch electrodes located in the non-bending region A2 and the non-bending region A3 and close to the bending region A1, for example, the second touch electrode 11a, the second touch electrode 11b, the second touch electrode 11c and the second touch electrode 11d shown in FIG. 1. Apparently, the present disclosure is not limited to this. In other embodiments, the part of the touch electrodes may further include the touch electrodes located in the bending region A1, for example, a second touch electrode lie shown in FIG. 1.

In a case that the flexible touch display panel 1 includes multiple bending regions, when the inductive signal of the second touch electrode 11, i.e., the channel capacitance value is detected by the drive device 12, the processing device may determine the non-bending region or the bending region where the second touch electrode 11 belongs based on coordinates of the second touch electrode 11, then obtain the folding angle of the non-bending region where the second touch electrode 11 belongs based on the channel capacitance value of the second touch electrode 11, and controls the display state of the non-bending region where second touch electrode 11 belongs based on the folding angle.

Figure 5:
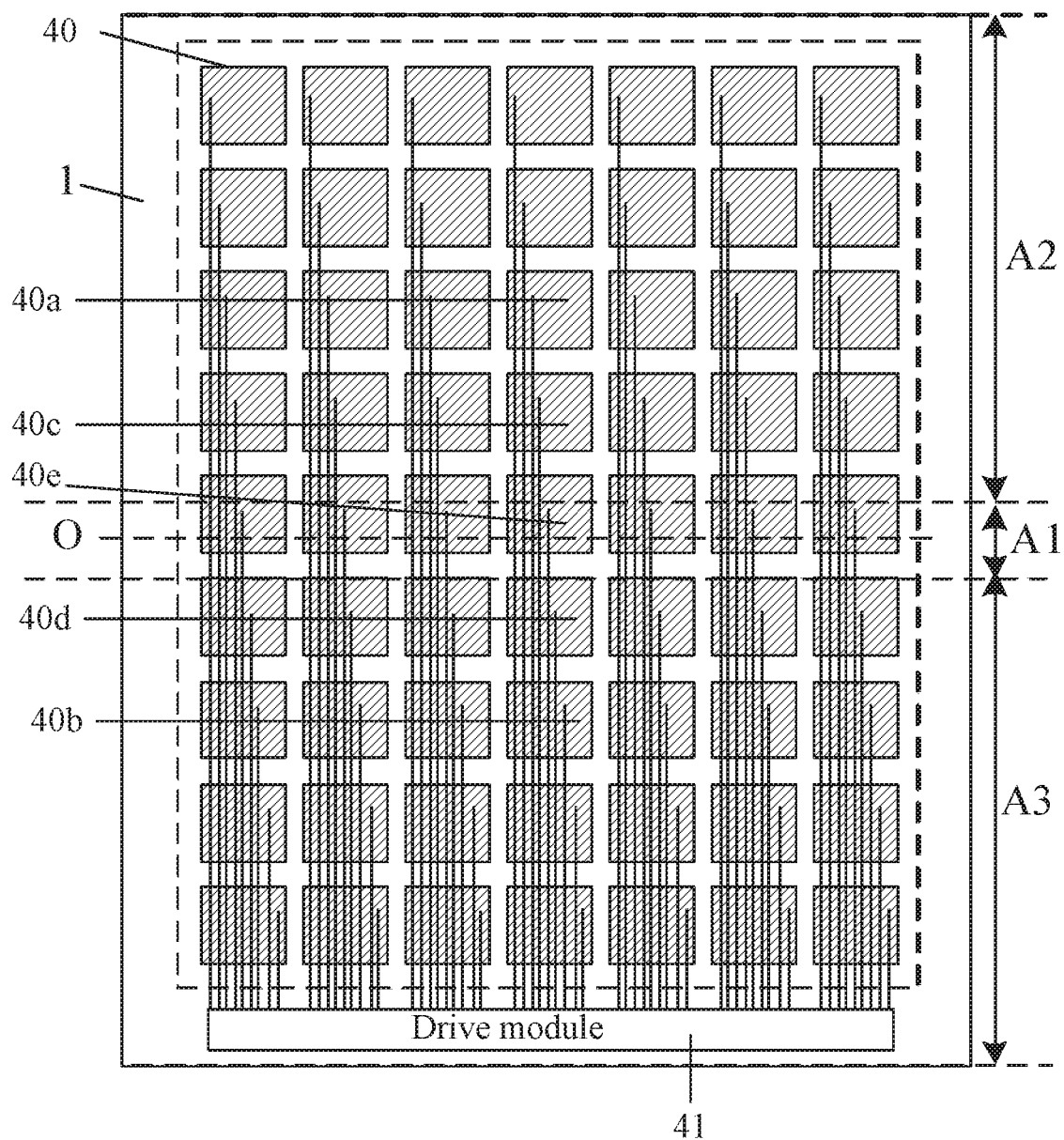
FIG. 5 is a top view showing a structure of a flexible touch display panel 1 according to another embodiment of the present disclosure.

In another embodiment of the present disclosure, the touch electrode in the flexible touch display panel 1 is a self-capacitance touch electrode. As shown in FIG. 5, which 5 is a top view showing a structure of a flexible touch display panel 1 according to another embodiment of the present disclosure, multiple touch electrodes 40 are arranged in an array, and each of the touch electrodes 40 is connected to a drive device 41 via a touch lead.

In the same way, the channel capacitance values of the touch electrode 40 at different folding angles α are obtained in advance. That is, the correspondence between the folding angle α and the channel capacitance value is obtained. Then, the channel capacitance values are divided into several intervals. When a real-time channel capacitance value is obtained, first, the real-time channel capacitance value is compared with thresholds of capacitance value intervals to obtain a capacitance value interval in which the real-time channel capacitance value is located. Then, the folding angle α corresponding to the real-time channel capacitance value is determined based on the correspondence between the capacitance value interval and the folding angle.

In a process of detecting the folding angle of the flexible touch display panel 1, the drive device 41 may constantly input the first scan signal to the touch electrode 40 and obtain the inductive signal outputted by the touch electrode 40. In a case that the flexible touch display panel 1 is touched, the drive device 41 determines the touch position based on the inductive signal outputted by the touch electrode 40. In a case that the flexible touch display panel 1 is not touched but the inductive signal outputted by the touch electrode 40 changes, the drive device 41 may transmit the inductive signal outputted by the touch electrode 40 to the processing device such that the processing device determines the folding angle α based on the correspondence between the folding angle α and the capacitance value interval.

In a case that the flexible touch display panel 1 is not touched, when the channel capacitance value of the touch electrode 40 is obtained, the processing device first determines whether the channel capacitance value is greater than the sleep threshold, which is the channel capacitance value of the touch electrode 40 obtained when the folding angle α is zero or approximately zero. Since as the folding angle α decreases, the channel capacitance value increases, a case that the obtained channel capacitance value is greater than the sleep threshold indicates that the folding angle α is zero, and the flexible touch display panel 1 may be controlled to enter the sleep state. In a case that the obtained channel capacitance value is less than the sleep threshold, which indicates that the folding angle α is greater than zero, the capacitance value interval in which the channel capacitance value is located is further determined, and then a current folding angle α of the flexible touch display panel 1 is determined based on the correspondence between the capacitance value interval and the folding angle α obtained in advance.

In the same way, according to the embodiment of the present disclosure, when the folding angle α of the flexible touch display panel 1 is detected, the current folding angle α may be obtained based on the channel capacitance values of all of the touch electrodes 40. However, for reducing workload of the processing device and the power consumption, the current folding angle α may also be obtained based on channel capacitance values of a part of the touch electrodes 40.

The part of the touch electrodes includes touch electrodes located in central regions of the non-bending region A2 and the non-bending region A3, for example, a touch electrode 40a and a touch electrode 40b shown in FIG. 5. In one embodiment, the part of the touch electrodes includes the touch electrodes located in the non-bending region A2 and the non-bending region A3 and close to the bending region A1, for example, a touch electrode 40c and a touch electrode 40d shown in FIG. 5. In one embodiment, the part of the touch electrodes includes the touch electrodes located in the central regions of the non-bending region A2 and the non-bending region A3 as well as the touch electrodes located in the non-bending region A2 and the non-bending region A3 and close to the bending region A1, for example, the touch electrode 40a, the touch electrode 40b, the touch electrode 40c and the touch electrode 40d shown in FIG. 5. Apparently, the present disclosure is not limited to this. In other embodiments, the part of the touch electrodes may further include the touch electrode located in the bending region A1, for example, a touch electrode 40e shown in FIG. 5.

With the method for detecting a folding angle of the flexible touch display panel 1 provided according to the embodiment of the present disclosure, the folding angle of the flexible touch display panel is obtained based on an induction value of the touch electrode, i.e., the channel capacitance value and the correspondence between the capacitance value interval and the folding angle, such that the accuracy of detecting the folding angle detection can be improved, and complexity and the production cost of the flexible touch display panel 1 can be reduced.

Figure 6:
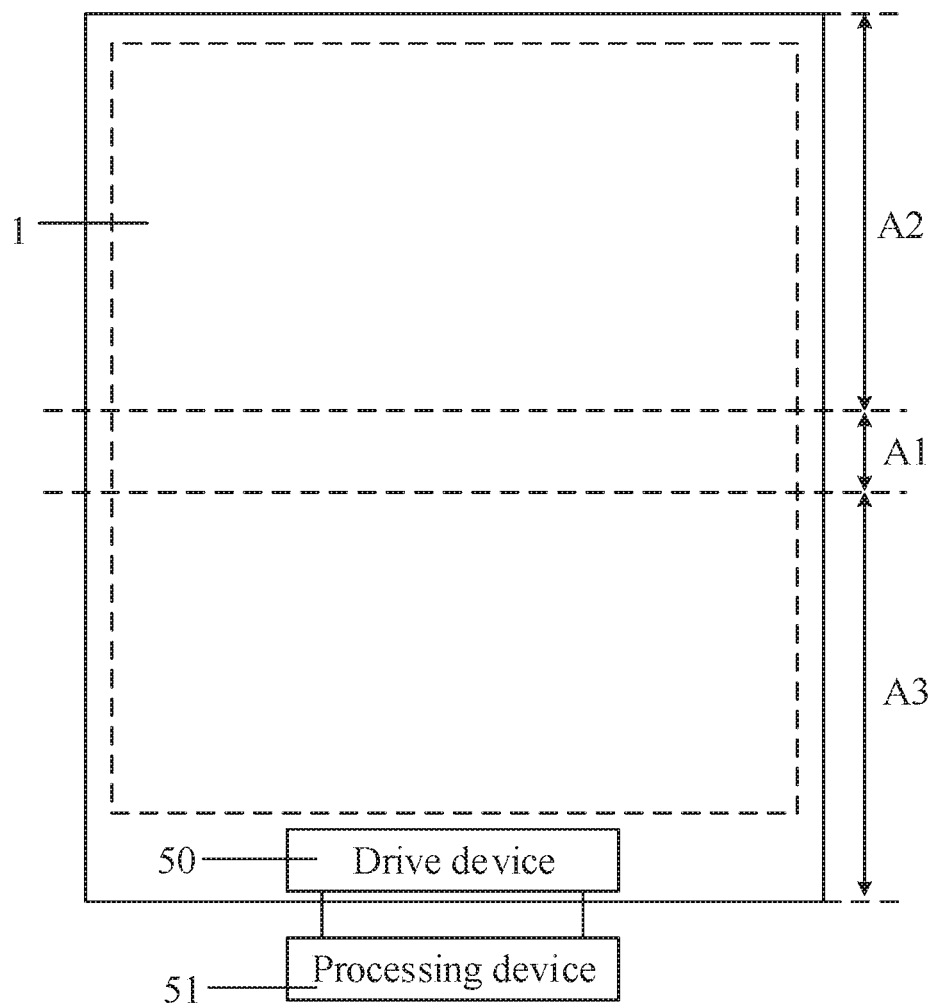
FIG. 6 is a schematic structural diagram of a system for detecting a folding angle of a flexible touch display panel 1 according to an embodiment of the present disclosure.

A system for detecting a folding angle of a flexible touch display panel is further provided according to the embodiment of the present disclosure. The system is applied to the method for detecting a folding angle according to any one of the above embodiments. As shown in FIG. 6, which is a schematic structural diagram of a system for detecting a folding angle of a flexible touch display panel 1 according to an embodiment of the present disclosure, the system for detecting a folding angle includes a drive device 50 and a processing device 51. It should be noted that the drive device 50 may be the drive device 12 shown in FIG. 1 or the drive device 41 shown in FIG. 5.

The drive device 50 is configured to input a first scan signal to a touch electrode and obtain a channel capacitance value of the touch electrode. The processing device 51 is configured to determine whether the channel capacitance value is greater than a sleep threshold, control the flexible touch display panel to enter a sleep state in a case that the channel capacitance value is greater than the sleep threshold, and determine a capacitance value interval in which the channel capacitance value is located and determine a current folding angle of the flexible touch display panel based on the correspondence between the capacitance value interval and the folding angle in a case that the channel capacitance is not greater than the sleep threshold.

The flexible touch display panel 1 shown in FIG. 1 is taken as an example. In a process of detecting the folding angle of the flexible touch display panel 1, the drive device 50 may constantly input the first scanning single to the first touch electrode 10 and obtain an inductive signal outputted by the second touch electrode 11. In a case that the flexible touch display panel 1 is not touched but the inductive signal outputted by the second touch electrode 11 changes, the drive device 50 may transmit the inductive signal outputted by the second touch electrode 11 to the processing device 51 of the flexible touch display panel 1 such that the processing device 51 determines the folding angle α based on the inductive signal, i.e., the channel capacitance value.

When the channel capacitance value of the second touch electrode 11 is obtained, the processing device 51 first determines whether the channel capacitance value is greater than the sleep threshold, controls the flexible touch display panel 1 to enter the sleep state in a case that the channel capacitance is greater than the sleep threshold, which indicates that the folding angle α is zero, and determine the capacitance value interval in which the channel capacitance value is located, and determine a current folding angle α of the flexible touch display panel 1 based on the correspondence between the capacitance value interval and the folding angle α in a case that the obtained channel capacitance value is less than the sleep threshold, which indicates that the folding angle α is greater than zero.

Moreover, when the current folding angle of the flexible touch display panel 1 is determined, the processing device 51 is further configured to control a display parameter of the flexible touch display panel 1 based on the current folding angle. The display parameter includes a brightness level and color coordinates.

In the embodiment, the drive device 50 is further configured to input a second scan signal to the touch electrode after the flexible touch display panel 1 is controlled to enter the sleep state. A frequency of the second scan signal is less than a frequency of the first scan signal.

The processing device 51 determines whether to control the flexible touch display panel to enter the sleep state through determining whether channel capacitance values of a part of the touch electrodes are greater than the sleep threshold.

The part of the touch electrodes includes the touch electrodes located in central regions of the non-bending regions, for example, the second touch electrode 11a and the second touch electrode 1b shown in FIG. 1 or the touch electrode 40a and the touch electrode 40b shown in FIG. 5. In one embodiment, the part of the touch electrodes includes touch electrodes located in the non-bending regions and close to the bending region, for example, the second touch electrode 11c and the second touch electrode 11d shown in FIG. 1 or the touch electrode 40c and the touch electrode 40d shown in FIG. 5. In one embodiment, the part of the touch electrodes includes the touch electrodes located in the central regions of the non-bending regions as well as the touch electrode located in the non-bending regions and close to the bending region, for example, the second touch electrode 11a, the second touch electrode 11b, the second touch electrode 11c and the second touch electrode 11d shown in FIG. 1 or the touch electrode 40a, the touch electrode 40b, the touch electrode 40c and the touch electrode 40d shown in FIG. 5.

The drive device 50 is a drive chip of the flexible touch display panel 1. The processing device 51 is a central processing unit of the flexible touch display panel 1.

It should be noted that the drive chip according to the embodiment of the present disclosure is the drive chip integrated with a touch position detection function and a folding angle detection function. However, the present disclosure is not limited to this. In other embodiments, the touch electrode may be connected to two drive chips. One of the drive chips is configured to detect the touch position, and the other of the drive chips is configured to detect the folding angle so as to improve detection efficiency of each of the drive chips.

Moreover, the drive chip in the embodiment of the present disclosure is further integrated with a function of controlling the flexible touch display panel 1 to display an image. That is, the drive chip provides an output signal to a pixel in the flexible touch display panel 1 via a data line, and provides a scan signal to a pixel in the flexible touch display panel 1 via a gate line, etc. However, the present disclosure is not limited to this. In other embodiments, the flexible touch display panel 1 may be controlled to display an image by another drive chip. It should be noted that no matter how many drive chips the flexible touch display panel 1 includes, the drive chips may communicate with each other so as to manage the display, the touch and the folding uniformly.

With the system for detecting the folding angle of the flexible touch display panel provided according to the embodiment of the present disclosure, a folding angle of the flexible touch display panel is obtained based on an induction value between the touch electrodes, i.e., the channel capacitance value and the correspondence between the capacitance value interval and the folding angle, such that accuracy of detecting a folding angle can be improved, and complexity and the production cost of the flexible touch display panel can be reduced.

A flexible touch display panel is further provided according to the embodiment of the present disclosure, which includes the system for detecting a folding angle according to any one of the above embodiments. The flexible touch display panel is a flexible touch display panel integrated with a touch electrode layer. In one embodiment, the touch electrode layer is embedded in the flexible touch display panel. Moreover, the flexible touch display panel includes an organic light-emitting flexible touch display panel, etc. The flexible touch display panel provided according to the embodiment of the present disclosure can achieve folding angle detection at a high accuracy, while having reduced complexity and a low production cost.

The invention claimed is:

1. A method for detecting a folding angle of a flexible touch display panel, wherein
    the flexible touch display panel comprises at least one bending region and non-bending regions located on both sides of the bending region, each of the bending region and the non-bending regions is provided with a plurality of touch electrodes, and
    the method comprises:
    inputting a first scan signal to the touch electrode and obtaining a channel capacitance value of the touch electrode, wherein the channel capacitance value is generated by the touch electrode in response to the first scan signal;
    determining whether the channel capacitance value is greater than a sleep threshold;
    controlling the flexible touch display panel to enter a sleep state in a case that the channel capacitance value is greater than the sleep threshold; and
    determining a capacitance value interval in which the channel capacitance value is located and determining a current folding angle of the flexible touch display panel based on a correspondence between the capacitance value interval and the folding angle in a case that the channel capacitance value is not greater than the sleep threshold, wherein the sleep threshold indicates the channel capacitance value of the touch electrode obtained when the folding angle of the flexible touch display panel is zero or approximately zero.

2. The method according to claim 1, further comprising:
    controlling a display parameter of the flexible touch display panel based on the current folding angle, wherein the display parameter comprises a brightness level and color coordinates.

3. The method according to claim 1, wherein after the controlling the flexible touch display panel to enter the sleep state, the method further comprises:
    inputting a second scan signal to the touch electrode, wherein a frequency of the second scan signal is less than a frequency of the first scan signal.

4. The method according to claim 1, wherein the determining whether the channel capacitance value is greater than the sleep threshold comprises:
    determining whether channel capacitance values of a part of the touch electrodes are greater than the sleep threshold.

5. The method according to claim 4, wherein the part of the touch electrodes comprises:
    a touch electrode located in a central region of the non-bending region,
    a touch electrode located in the non-bending region and close to the bending region, or
    a touch electrode located in the central region of the non-bending region and a touch electrode located in the non-bending region and close to the bending region.

6. The method according to claim 1, wherein in the flexible touch display panel, a plurality of touch electrodes are arranged in an array.

7. The method according to claim 1, wherein
    the touch electrodes comprises a first touch electrode and a second touch electrode, a plurality of first touch electrodes are arranged in a first direction, a plurality of second touch electrodes are arranged in a second direction, the first direction is perpendicular to the second direction, and
    the inputting a first scan signal to the touch electrode and obtaining a channel capacitance value of the touch electrode comprises:
    inputting the first scan signal to the first touch electrode and obtaining a channel capacitance value of the second touch electrode.

8. A system for detecting a folding angle of a flexible touch display panel, wherein
    the flexible touch display panel comprises at least one bending region and non-bending regions located on both sides of the bending region, each of the bending region and the non-bending regions is provided with a plurality of touch electrodes, and
    the system comprises:
    a drive device configured to input a first scan signal to the touch electrode and obtain a channel capacitance value of the touch electrode, wherein the channel capacitance value is generated by the touch electrode in response to the first scan signal, and
    a processing device configured to determine whether the channel capacitance value is greater than a sleep threshold, control the flexible touch display panel to enter a sleep state in a case that the channel capacitance value is greater than the sleep threshold, and determine a capacitance value interval in which the channel capacitance value is located and determine a current folding angle of the flexible touch display panel based on a correspondence between the capacitance value interval and the folding angle in a case that the channel capacitance value is not greater than the sleep threshold, wherein the sleep threshold indicates the channel capacitance value of the touch electrode obtained when the folding angle of the flexible touch display panel is zero or approximately zero.

9. The system according to claim 8, wherein the processing device is further configured to control a display parameter of the flexible touch display panel based on the current folding angle of the flexible touch display panel after the current folding angle is determined, wherein the display parameter comprises a brightness level and color coordinates.

10. The system according to claim 8, wherein the drive device is further configured to input a second scan signal to the touch electrode after the flexible touch display panel is controlled to enter the sleep state, wherein a frequency of the second scan signal is less than a frequency of the first scan signal.

11. The system according to claim 8, wherein the processing device is configured to determine whether to control the flexible touch display panel to enter the sleep state through determining whether channel capacitance values of a part of the touch electrodes are greater than the sleep threshold.

12. The system according to claim 11, wherein the part of the touch electrodes comprises:
a touch electrode located in a central region of the non-bending region,
a touch electrode located in the non-bending region and close to the bending region, or
a touch electrode located in a central region of the non-bending region and a touch electrode located in the non-bending region and close to the bending region.

13. The system according to claim 8, wherein the drive device is a drive chip of the flexible touch display panel, and the processing device is a central processing unit of the flexible touch display panel.

14. A flexible touch display panel, comprising:
a system for detecting a folding angle of a flexible touch display panel, wherein
the flexible touch display panel comprises at least one bending region and non-bending regions located on both sides of the bending region, each of the bending region and the non-bending regions is provided with a plurality of touch electrodes, and
the system comprises:
a drive device configured to input a first scan signal to the touch electrode and obtain a channel capacitance value of the touch electrode, wherein the channel capacitance value is generated by the touch electrode in response to the first scan signal, and
a processing device configured to determine whether the channel capacitance value is greater than a sleep threshold, control the flexible touch display panel to enter a sleep state in a case that the channel capacitance value is greater than the sleep threshold, and determine a capacitance value interval in which the channel capacitance value is located and determine a current folding angle of the flexible touch display panel based on a correspondence between the capacitance value interval and the folding angle in a case that the channel capacitance value is not greater than the sleep threshold, wherein the sleep threshold indicates the channel capacitance value of the touch electrode obtained when a folding angle of the flexible touch display panel is zero or approximately zero.

* * * * *